US006972364B2

(12) United States Patent
Diedrichsen

(10) Patent No.: US 6,972,364 B2
(45) Date of Patent: Dec. 6, 2005

(54) USER INTERFACE AND A SYNTHESIZER WITH A USER INTERFACE

(75) Inventor: Steffan Diedrichsen, Hamburg (DE)

(73) Assignee: Apple Computer, Inc., Cupertino, CA (US)

( * ) Notice: Subject to any disclaimer, the term of this patent is extended or adjusted under 35 U.S.C. 154(b) by 205 days.

(21) Appl. No.: 10/427,638

(22) Filed: Apr. 30, 2003

(65) Prior Publication Data

US 2004/0216588 A1 Nov. 4, 2004

(51) Int. Cl.[7] .......................... G10H 1/12; G10H 5/00; H03H 7/01

(52) U.S. Cl. ........................ 84/661; 715/716; 715/727; 715/771; 715/830

(58) Field of Search .......................... 84/661; 345/173; 381/98; 715/716, 719, 733, 736, 771, 830, 715/839, 727

(56) References Cited

U.S. PATENT DOCUMENTS 5,416,847 A * 5/1995 Boze .......................... 381/94.3
5,559,301 A * 9/1996 Bryan et al. .................. 84/653
6,229,456 B1 * 5/2001 Engholm et al. ............. 341/35
6,359,632 B1 * 3/2002 Eastty et al. ................ 715/716
6,765,590 B1 * 7/2004 Watahiki et al. ............ 715/716
2001/0043199 A1 * 11/2001 Eastty et al. ................ 345/173

* cited by examiner

*Primary Examiner*—Jeffrey W Donels
(74) *Attorney, Agent, or Firm*—Blakely, Sokoloff, Taylor & Zafman LLP

(57) ABSTRACT

A synthesiser to generate sounds often in a musical environment but also in a speech environment. Such synthesis of sounds is often accompanied by at least one mode of filtering or many modes. Hitherto, the application of such filtering has involved a control for each filter. This may be by way of a lever, toggle or rotatable knob. Thus, a user when applying the filters is required to adjust each control independently of the other. This enhances the complexity and a large amount of skill is involved in accurately selecting the required amount and types of filtering.

Thus, the present invention is directed towards a user interface for controlling the filtering of a signal input (such as a sound), said user interface comprising a rotatable controller having two or more sectors, each sector of said controller corresponding to a respective filter, whereby in use said controller is rotated to align said sectors with respect to said signal input thereby controlling the application of the filters to the signal input.

12 Claims, 2 Drawing Sheets

USER INTERFACE AND A SYNTHESIZER WITH A USER INTERFACE

FIELD OF THE INVENTION

The present invention relates to a user interface and to a synthesizer and in particular but not exclusively to a user interface in a synthesizer.

BACKGROUND OF THE INVENTION

A synthesizer is provided to generate sounds often in a musical environment but also in a speech environment. The complexity of such synthesizers has developed enormously over the last decade. None the less, such synthesis of sounds is often accompanied by at least one mode of filtering or many modes. These modes may include any one of low-pass filtering, high-pass filtering, band-pass filtering, notch filtering, peak filtering or comb filtering as well as discrete filtering for each octave. Moreover, when there are more than two filters, they may be applied in series or in parallel.

Hitherto, the application of such filtering has involved a control for each filter. This may be by way of a lever, toggle or rotatable knob. Thus, a user when applying the filters is required to adjust each control independently of the other. This enhances the complexity and a large amount of skill is involved in accurately selecting the required amount and types of filtering.

COPYRIGHT NOTICE

A portion of the disclosure of this patent document contains material which is subject to copyright protection. The copyright owner has no objections to the facsimile reproduction by anyone of the patent document or the patent disclosure, as it appears in the Patent and Trade Mark Office patent file or records, but otherwise reserves all copyright rights whatsoever. Copyright Apple Computer, Inc. 2002.

SUMMARY OF THE INVENTION

The present invention is thus directed towards a user interface for facilitating the filtering of an input signal and to a synthesizer with such a user interface.

Accordingly, the present invention relates to a user interface for controlling the filtering of a signal input, said user interface comprising a rotatable controller having two or more sectors, each sector of said controller corresponding to a respective filter, whereby in use said controller is rotated to align said sectors with respect to said signal input thereby controlling the application of the filters to the signal input.

The present invention also relates to a synthesizer including such a user interface.

BRIEF DESCRIPTION OF THE DRAWINGS

Embodiments of the present invention will now be described by way of further example only and with reference to the accompanying drawings, in which.

DETAILED DESCRIPTION OF THE INVENTION

Figure 1:
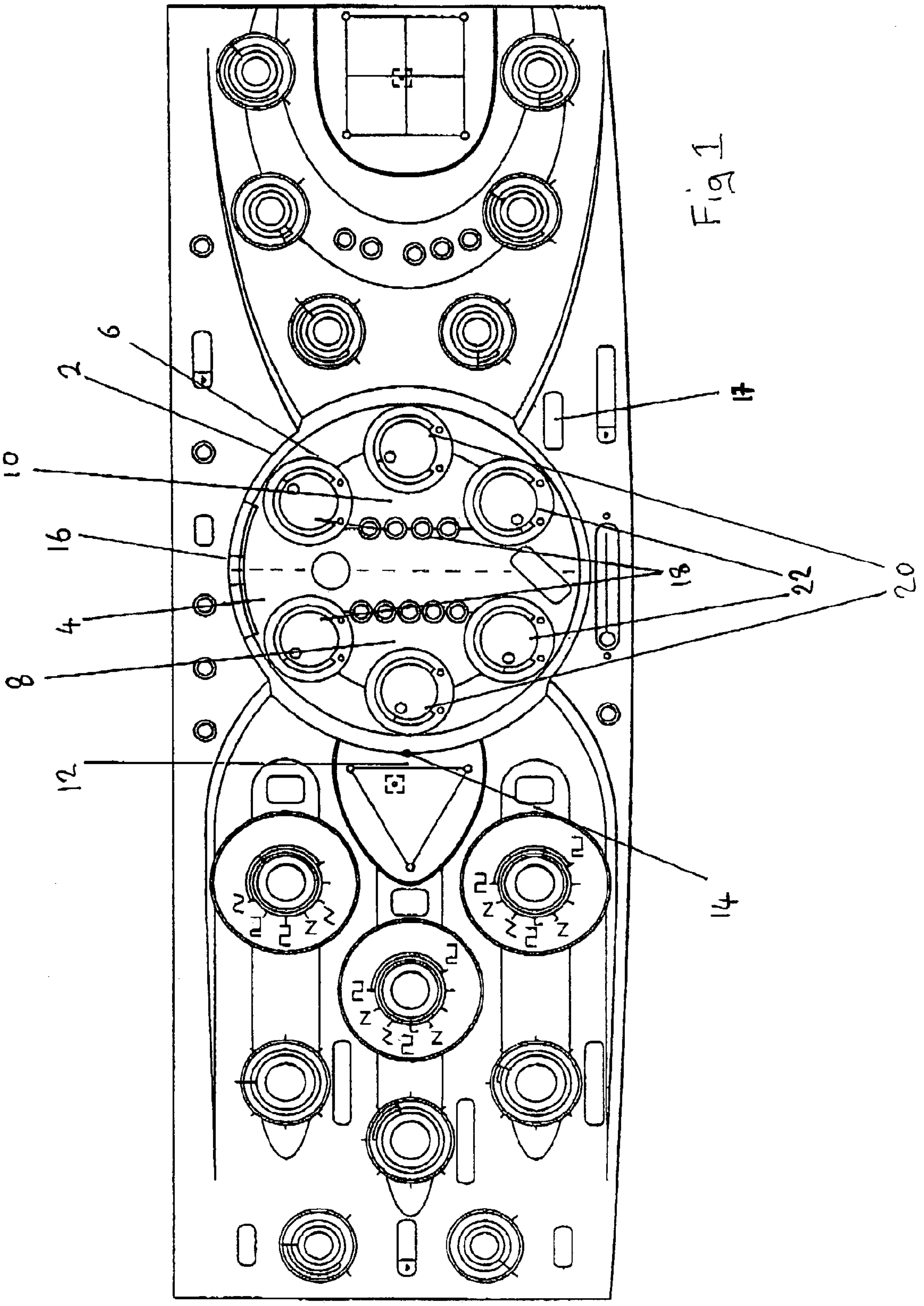
FIG. 1 illustrates a user interface according to a first embodiment of the present invention.

In FIG. 1 there is shown a user interface according to the first embodiment of the present invention. The user interface comprises a rotatable controller 2. The rotatable controller 2 may be part of a synthesizer for creating and/or editing sounds (e.g. music). The controller is defined by two sectors 4 and 6, each having a 90° arc. Each sector 4, 6 relates to a filter 8, 10.

A signal input 12 is represented as being input at position 14 with respect to the rotatable controller 2. Position 14 is located at 270° degrees with respect to the user interface.

Figure 2:
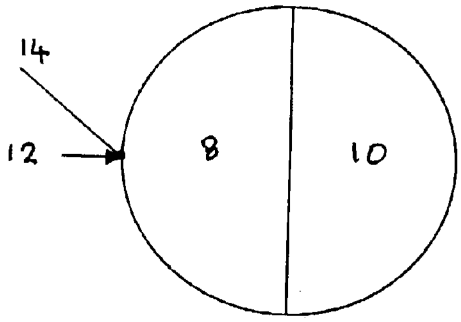
FIGS. 2 and 3 illustrate schematically an operation of the user interface according to the first embodiment of the present invention.

In operation, a user, when using the user interface, rotates the rotatable controller 2 to vary the application of filters 8 and 10. FIG. 2 is a schematic illustration of the first embodiment when the filters are aligned with the 0° and 180° positions with respect to the user interface and so apply the filters in series. That is to say, the input signal is fed into filter section 8 and the output of which is passed to filter section 10. FIG. 1 shows the rotatable controller 2 set to achieve the alignment of the filters as shown in FIG. 2 to obtain serial filtering. The rotatable controller 2 is coupled electrically to the filtering logic to implement the user selected filtering.

Figure 3:
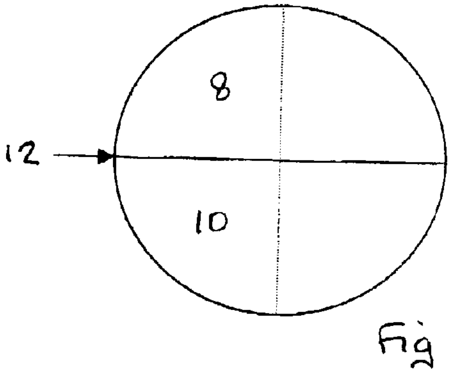

FIG. 3 schematically illustrates when the filters are aligned with the 90° and 270° positions and so apply the filters in parallel. That is to say, the input signal is fed to both filter sections and the outputs of both filters 8 and 10 are mixed. The alignment of FIG. 3 may be achieved by rotating the rotatable controller 2, as shown in FIG. 1, 90° in the clockwise direction.

A balance control 16 shown in FIG. 1 varies the relative proportion of filters 8 and 10 being applied to the input signal.

Each of the filters 8 and 10 also includes variable controllers 18, 20, 22. The variable controllers each comprise a rotatable knob disposed on one of the respective filters 8 or 10. In this embodiment of the present invention, there are three variable controllers for each filter. Each of the rotatable knobs can be rotated from an off position to a maximum position.

Variable controller 18 defines a cut-off frequency for the filter. Variable controller 20 defines a resonance frequency for the filter. Variable controller 22 for filter 8 defines a driving frequency to determine which type of filtering is effected. For example, filtering could be low-pass, high-pass, peak, notch or band filtering. Variable controller 22 for filter 10 defines the frequency modulation to determine the discrete filtering which is being effected.

Figure 4:
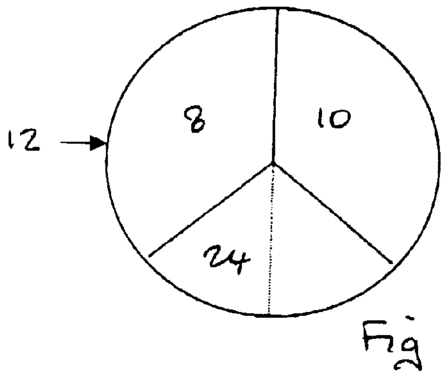
FIGS. 4 and 5 illustrate schematically an operation of a second embodiment of the present invention.
Figure 5:
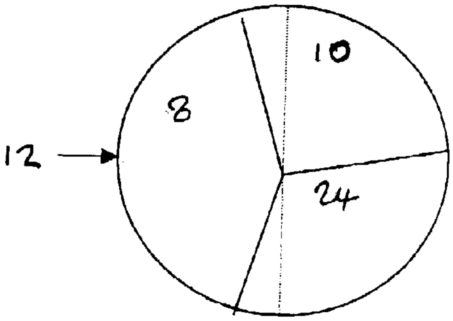

The rotatable controller 2 may comprise not just two filters but any number of filters. FIGS. 4 and 5 schematically illustrate a rotatable controller with three filters in accordance with the second embodiment. In FIG. 4, filters 8, 10 and 24 each command a sector of 120°. Filters 8 and 10 are aligned with 0° and filter 24 with 60° and 210°. Thus, in FIG. 4, filters 8 and 10 are applied in series to the input signal with filter 24 being applied also in series either in between filters 8 and 10 or after filter 10.

FIG. 5 illustrates the rotatable control means whereby filters 8, 10 and 24 are each applied in parallel to each other. Alternatively, filter 8 is applied to the input signal and the output of which is fed to filters 10 and 24 being applied in parallel to each other.

A switch such as shown at 17 in FIG. 1 can be used to select among the variations when there are three or more filters.

The user interface of the present invention provides a control for the filtering which enables a user to vary the mode and relative application of each of the filters, thus overcoming the overly complex user interface used hitherto. Such a user interface has particular application in a synthesizer.

The foregoing description has been given by way of example only and it will be appreciated by a person skilled in the art that modifications can be made without departing from the scope of the present invention.

What is claimed is:

1. A user interface for controlling the filtering of a signal input, said user interface comprising a rotatable controller having two or more sectors, each sector of said controller corresponding to a respective filter, whereby in use said controller is rotated to align said sectors with respect to a representation of said signal input thereby controlling the application of the filters to the signal input.

2. A user interface as claimed in claim 1, in which said filters are applied in series or in parallel.

3. A user interface as claimed in claim 1, further comprising a variable controller for varying the filtering of at least one filter.

4. A user interface as claimed in claim 2, further comprising a variable controller for varying the filtering of at least one filter.

5. A user interface as claimed in claim 3, in which said variable controller comprises at least one rotatable control input.

6. A user interface as claimed in claim 4, in which said variable controller comprises at least one rotatable control input.

7. A physical user interface as claimed in claim 5, in which said rotatable control input is disposed within the sector for said at least one filter.

8. A physical user interface as claimed in claim 6, in which said rotatable control input is disposed within the sector for said at least one filter.

9. A user interface as claimed in claim 1, further comprising a balance control for altering the relative application of the filters.

10. A user interface as claimed in claim 1 in which one of said filters comprises at least one of low-pass filtering, high-pass filtering, band-pass filtering, peak filtering or notch filtering.

11. A user interface as claimed in claim 10, in which another of said filters comprises a discrete low pass filter.

12. A synthesiser including a user interface as claimed in claim 1.

* * * * *